United States Patent [19]

Sakurai

[11] Patent Number: 5,023,191
[45] Date of Patent: Jun. 11, 1991

[54] METHOD OF PRODUCING A SEMICONDUCTOR DEVICE USING A SINGLE MASK METHOD FOR PROVIDING MULTIPLE MASKING PATTERNS

[75] Inventor: Kenya Sakurai, Matumoto, Japan

[73] Assignee: Fuji Electric Co., Ltd., Kawasaki, Japan

[21] Appl. No.: 444,567

[22] Filed: Dec. 1, 1989

[30] Foreign Application Priority Data

Dec. 1, 1988 [JP] Japan ............... 63-304494

[51] Int. Cl.⁵ .................. H01L 21/00; H01L 21/02; H01L 21/265; H01L 21/306

[52] U.S. Cl. ........................... 437/27; 437/28; 437/29; 437/31; 437/40; 148/DIG. 82; 148/DIG. 83; 357/23.1; 357/34; 357/41

[58] Field of Search ............... 437/27, 28, 29, 31, 437/32, 34, 40, 41; 148/DIG. 82, DIG. 83, DIG. 106; 357/23.1, 33, 34, 35, 40, 41

[56] References Cited

U.S. PATENT DOCUMENTS

| 4,466,176 | 8/1984 | Temple ............................. 437/27 |
| 4,649,629 | 3/1987 | Miller et al. ..................... 437/27 |
| 4,702,797 | 10/1987 | Shimano et al. ................. 437/27 |
| 4,748,103 | 5/1988 | Hollinger ........................ 437/28 |
| 4,795,716 | 1/1989 | Yilmaz et al. .................. 357/23.1 |
| 4,835,112 | 5/1989 | Pfiester et al. ................. 437/27 |
| 4,843,023 | 6/1989 | Chiu et al. ...................... 437/27 |
| 4,851,365 | 7/1989 | Jeuch ............................... 437/40 |
| 4,889,820 | 12/1989 | Mori ................................ 357/23.1 |
| 4,902,636 | 2/1990 | Akiyama et al. ............... 437/40 |
| 4,971,921 | 11/1990 | Fukunaga et al. .............. 437/40 |

FOREIGN PATENT DOCUMENTS

| 0022856 | 2/1980 | Japan ............................. 437/27 |
| 0066967 | 3/1988 | Japan ............................. 437/40 |
| 0284860 | 11/1988 | Japan ............................. 437/27 |
| 0248565 | 10/1989 | Japan ............................. 437/40 |
| 0051276 | 2/1990 | Japan ............................. 437/40 |

Primary Examiner—Brian E. Hearn
Assistant Examiner—B. Everhart
Attorney, Agent, or Firm—Brumbaugh, Graves, Donohue & Raymond

[57] ABSTRACT

A single mask method for providing multiple masking patterns, using excess etching techniques, which is usable for developing a semiconductor substrate for a semiconductor device which results in an increased current being required before latchup occurs in the semiconductor device.

10 Claims, 2 Drawing Sheets

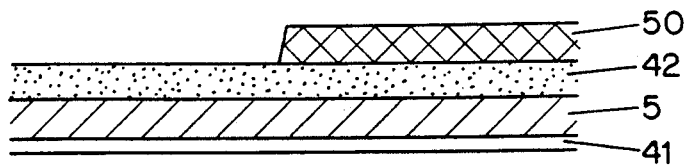
FIG. 1(a)
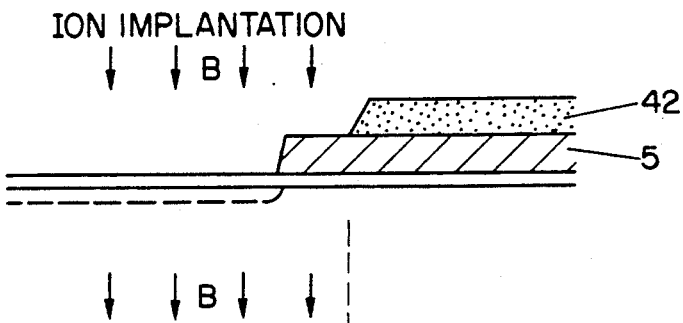
FIG. 1(b)
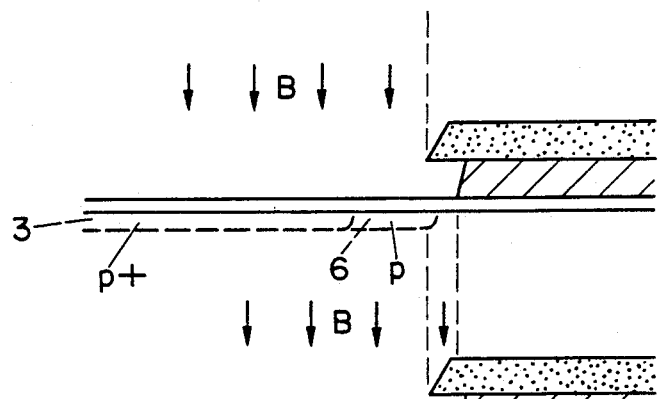
FIG. 1(c)
FIG. 1(d)
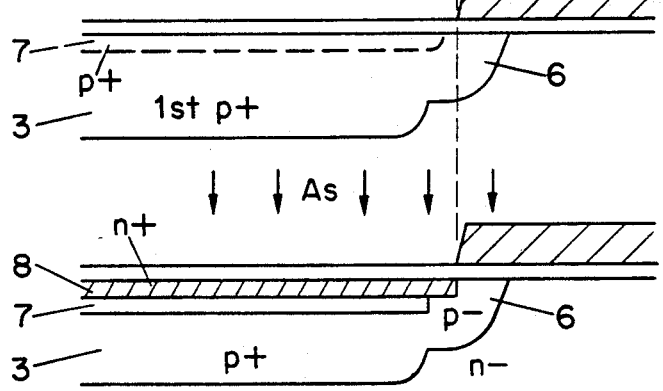
FIG. 1(e)
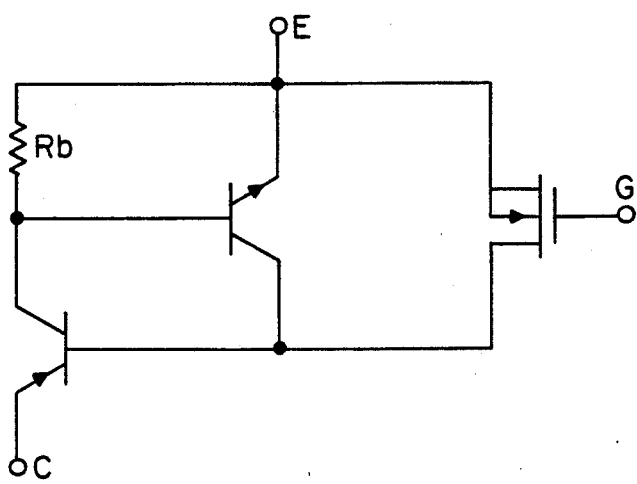
FIG. 3

METHOD OF PRODUCING A SEMICONDUCTOR DEVICE USING A SINGLE MASK METHOD FOR PROVIDING MULTIPLE MASKING PATTERNS

BACKGROUND OF THE INVENTION

The present invention relates to a method of producing a MOS type power device having an insulation gate such as a power MOSFET and an IGBT, which is capable of preventing the generation of the ON phenomenon, latchup, and the like, of a parasitic bipolar transistor and a parasitic thyristor.

Latchup, which may lead to the breakdown of this kind of semiconductor, and a conventional means for avoiding the phenomenon, will be explained with respect to what is called an IGBT, which is used as an example of a semiconductor.

Referring now to FIG. 2, a sectional view of the main part of a general IGBT, and FIG. 3 an equivalent circuit diagram of the IGBT, when the ON current is applied to the IGBT, the hole current Ip flows from a collector electrode 12 to an n⁻ drift region 1 passing through a p+ diffusion region 10 and an n+ buffer region 2. Ip then passes through a p diffusion region 6 to flow into an emitter electrode 11. During this time, holes pass through a shunting resistance portion 43, which is situated directly under the n+ emitter region 8 in the p diffusion region 6.

The current Ip, caused by the holes, produces a voltage drop $V_F = I_p \times R_b$, wherein Rb represents the resistance of the shunting resistance portion 43. The voltage drop $V_F$ is such that the n+p junction of the n+ emitter region 8 and the p diffusion region 6 is forwardly biased. The forward bias volta $V_A$ is represented by $V_A = \alpha_{PNP} \cdot R_b \cdot I_c$, wherein $\alpha_{PNP}$ represents the gain of a PNP transistor consisting of the p+ diffusion layer 10, the n+, n⁻ diffusion layer (2, 1) and the p diffusion layer 6.

When an NPN transistor consisting of the n⁻ diffusion layer 1, the p diffusion layer 6 and the n+ diffusion layer 8 is turned on, and the condition $\alpha_{PNP} + \alpha_{NPN} = 1$ is satisfied, the parasitic thyristor assumes latchup, which makes the control of the transistor by a gate signal impossible, and results in the breakdown thereof. This phenomenon is called latchup and the current initiating the latchup is called latchup current.

It is already known that the latchup current is represented by the formula $I_L + 0.7/\alpha_{PNP} \cdot R_b$. It is also clear from this formula that if the resistance Rb is reduced, the breakdown of the IGBT is prevented while the current required for latchup to occur increases.

Conventional solutions to the problem of latchup are: introducing a lifetime killer to the n+ region 1; reducing $\alpha_{PNP}$ by increasing the impurity density of the n+ buffer layer 2; and bypassing the hole current by modifying the p+ diffusion layer 7 shown in FIG. 2 so as to prevent the partial operation of the channel as a p+ diffusion layer 44 as shown in FIG. 4. All of these methods, however, increase the ON voltage drop of the IGBT.

It is known in the prior art that if the resistance is reduced by shortening the length $L_E$ of the n+ region portion, directly under which the shunting resistance region 43 is formed, as much as possible, as shown in FIG. 4, the increase in ON voltage drop is prevented. Although the increase in the ON voltage drop is prevented by shortening the length $L_E$, it is impossible to obtain a sufficiently high latchup current value, since the length $L_E$ of the n+ emitter region required must be less than 2 to 3 microns, a limitation beyond the accuracy of the photo process.

Accordingly, it is an object of the present invention to provide a method of producing a semiconductor device which is capable of reducing the resistance Rb of the shunting resistance portion 43 as much as possible without increasing the ON voltage drop of the semiconductor device, obtaining a larger latchup current, and greatly improving the turn-off and load short-circuit withstand voltage during the actual use of the semiconductor device.

SUMMARY OF THE INVENTION

The present invention provides a method of producing a semiconductor device that has a first conductivity type semiconductor base layer, a second conductivity type first region provided on the surface of the first conductivity type semiconductor base layer, a second conductivity type second region which is within the first region and is diffused more deeply, a second conductivity type third region which is diffused concentrically with and more shallowly than either of the first and the second regions, a first conductivity type region which is within the first region bestriding the second and the third regions and is diffused more shallowly than the third region, and a gate electrode provided on the surface of the portion of the first region sandwiched between the first conductivity type semiconductor base layer and the first conductivity type region through an insulation film.

The method comprises the steps of: excessively etching the insulation film formed on a polysilicon which will constitute the gate electrode in the planar direction (horizontal in this embodiment) so as to form a predetermined distance between the edges of the outer peripheries of the first region and the second region relative to the polysilicon; implanting ions for forming the second region while using the polysilicon as a mask; etching the polysilicon so excessively in the planar direction so as to provide the short-circuit resistance portion of the first region directly under the first conductivity type region with a necessary minimum length while using the insulation film as a mask; implanting and diffusion ions for forming the first region, thereby forming the first and the second regions; forming the third region; removing the insulation film from the polysilicon; and forming the first conductivity type region while using the polysilicon as a mask.

BRIEF DESCRIPTION OF THE DRAWINGS

FIG. 1 shows a process of an embodiment of a method of producing a semiconductor device according to the present invention;

FIG. 3 is an equivalent circuit diagram of the IGBT;

DESCRIPTION OF THE PREFERRED EMBODIMENT

Figure 2:
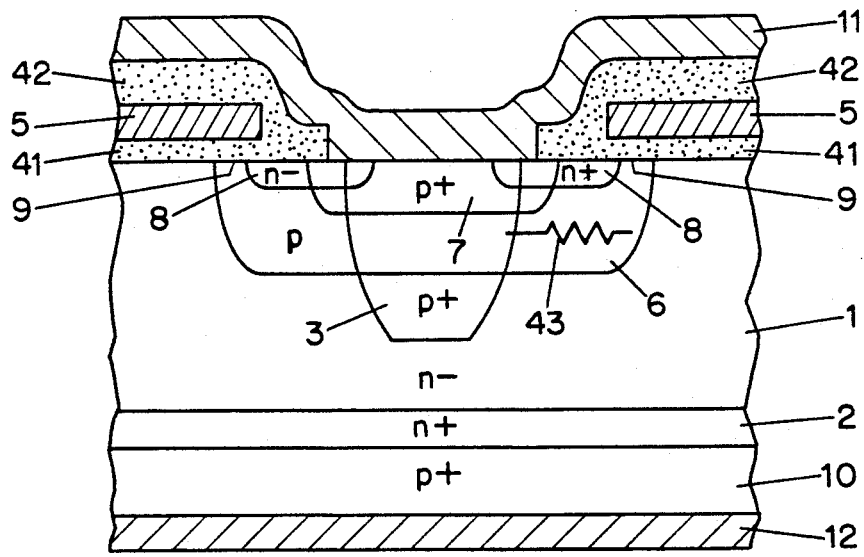
FIG. 2 is a sectional view of an IGBT.
Figure 4:
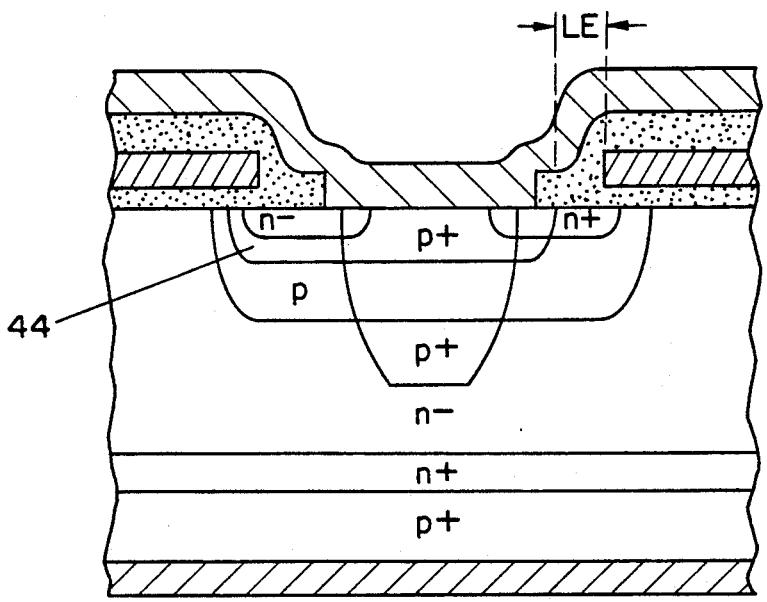
FIG. 4 is a sectional view of a conventional IGBT, showing an example of a means for reducing Rb.

In order to achieve the aim of preventing the breakdown while increasing the current required for latchup, it is important to bring the p+ (conductivity type one) diffusion layer 3 close to the channel side edge of the n+

(conductivity type two) emitter region 8 to such an extent as not to fluctuate the threshold voltage and to bring the p+ diffusion region 7 to the channel side edge of the n+ emitter region 8, thereby reducing the resistance Rb. For this purpose, in a conventional method which uses a photo process, it is necessary to repeat the photo process three times with different masking patterns. Due to registration constraints, it is impossible to obtain such a high degree of pattern matching accuracy required in this type of semiconductor device from the pattern matching accuracy and the etching accuracy available in the prior art.

In accordance with the present invention, however, only one photo process is needed to form the four regions which contribute to the determination of the latchup current value, namely, the p+ region 3, the p region 6, the p+ region 7, and the n+ region 8. The one photo process establishes a complete self alignment diffusion method. By this method, it is possible to make the length $L_E$ of the shunting resistance portion as small as approximately 0.5 microns, thereby greatly reducing the resistance Rb and increasing the latchup current and, hence, the latchup withstand voltage. Furthermore, the approach of the p+ diffusion region 3 to the channel side edge of the n+ emitter region 8 is accurately controlled.

An embodiment of a method of manufacturing a semiconductor device according to the present invention will now be explained in detail with reference to the accompanying drawings.

FIGS. 1(a) to 1(e) are sectional views of a series of steps of a method of the present invention.

In FIG. 1(a), a layer of semiconductor material such as polysilicon 5, is formed on a gate oxide film 41 on the surface of an n− silicon semiconductor substrate (see substrate 1 in FIG. 2). Insulation film (silicon oxide film) 42 is then grown on the polysilicon 5. Furthermore, an etching mask such as a patterned photoresist 50, defining a first opening, is placed on the insulation film 42, for use in the subsequent selective etching step shown in FIG. 1(b).

As shown in FIG. 1(b), the insulation film 42 is etched by an excess, to a predetermined distance, inwardly under the edge of the photoresist 50, e.g., 7 to 8 microns, to form a second opening substantially coextensive with, but larger than the first opening. Thus, as shown in FIG. 1(b), the insulation film 42 has been etched in an amount or degree exceeding that necessary to remove areas not covered by the photoresist, so as to be etched away so that its edge as shown is about 7 to 8 microns to the right of where the edge of the opening defined by the photoresist was (as shown in FIG. 1(a) at 50).

Using the photoresist as an etching mask, the polysilicon 5 is then selectively etched in conformity with the pattern of the photoresist 50 as shown in FIG. 1(b), to form a third opening substantially coextensive with the first opening. After the removal of the photoresist 50, highly concentrated B+ (boron) is implanted within the window formed by edges of the polysilicon 5 at a high energy, thereby forming an initial region of the p+ diffusion region shown dotted.

Thereafter, as shown in FIG. 1(c), the polysilicon 5 is etched by an excess degree to a predetermined distance, e.g., 0.5 micron, inwardly under the edge of the insulation film 42 by dry etching, using the insulation film 42 as a mask under the most isotropic condition possible, to form a fourth opening substantially coextensive with, but larger than, said second opening.

B+ (boron) having a comparatively low concentration is then implanted so as to form the initial region of the p diffusion region 6, as also shown in FIG. 1(c). In this way, by controlling the amount or degree of excess etching, it is possible to accurately control the distance between the p+ diffusion region 3 (FIG. 1(b) implantation) and the p diffusion region 6 (FIG. 1(c) implantation).

One of the important features of the present invention is that it is possible to control the amount of etching of the polysilicon 5, as shown in FIG. 1(c), to an accuracy of 0.5 micron, which is higher than the 2 to 1 micron accuracy in a conventional photo process pattern. It will be appreciated that the limitations in conventional processes using multiple masks is inherent in the impossibility of achieving perfect registration of successive mask patterns.

Thereafter, the p+ diffusion region 3 and the p diffusion region 6 are formed to their final configuration by drive diffusion, as shown in FIG. 1(d). Highly concentrated B+ (boron) is then implanted at a high energy while the insulation film 42 is used as a mask, thereby forming the p+ diffusion region 7. The insulation film 42 on the polysilicon (gate electrode) 5 is then removed from desired areas by wet etching to uncover the polysilicon 5 as shown in FIG. 1(e).

Generally, drive-in is carried out to a thickness of about 500 Å (not shown) to make the polysilicon surface state suitable for laminating a thick oxide film thereon in a post step. As shown in FIG. 1(e), the diffusion process is completed by implanting ions to form the n+ emitter region 8. Thereafter, a semiconductor device is produced in accordance with a known manufacturing process. While specific excess etching dimensions or measurements are stated in describing this embodiment, it will be understood that such dimensions may be varied in use of the invention.

The advantages of the present invention, i.e., forming four diffusion regions with an accurate positional relationship by only one photo process, are at least twofold: a semiconductor device is produced with increased latchup withstand voltage, providing increased breakdown protection; and greater economic efficiency is achieved, since the number of photo processes required is reduced to one and registration limitations are avoided.

Further, in a semiconductor device produced in accordance with the present invention, the length $L_E$ of the n+ emitter region 8, directly under which the shunting resistance region 43 is formed, can be reduced from 2 to 3 microns in the prior art to about 0.5 micron, and the p+ diffusion region 3 shown in FIG. 1 can be controlled such that it is brought much closer to the channel side edge of the n+ emitter region. In addition, since it is not necessary to control the approach or position of the edges by prolonging the diffusion time, as done in the prior art, it is possible to reduce the depth of the p+ diffusion region 3. Accordingly, it is also possible to reduce the ON voltage drop, since the thickness of the n− drift layer 1 may be reduced due to the shallower p+ diffusion layer 3.

Figure 5:
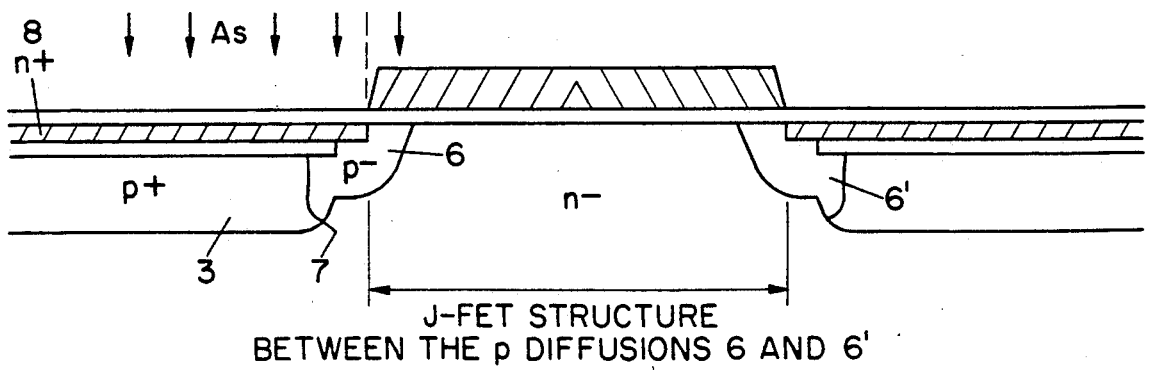
FIG. 5 shows the J-FET structure between the p diffusions 6 and 6'.

Although the ON voltage drop increases as a result of the current path being narrowed by the widening depletion layer, due to the J-FET (junction transistor) structure between the p diffusion layers 6 and 6' as shown in FIG. 5, this increase is small compared to the increase obtained with conventional solutions to the problem of latchup.

Utilizing the manufacturing method of the present invention, the resistance Rb was reduced to about 50%, and the current required for latchup was increased by about 70%, as compared to prior devices.

According to the present invention, as explained above, it is possible to produce a semiconductor device in which the resistance Rb of the shunting resistance portion 43 is very significantly reduced without a significant increase in the ON voltage drop, thereby increasing the current required for latchup, and greatly increasing the turn-off and load short-circuit withstand voltage during the actual use of the semiconductor device.

I claim:

1. A single mask method for providing multiple masking patterns usable for developing a semiconductor substrate for a semiconductor device, comprising the steps of:
   (a) forming an etching mask having a first opening exposing an area of an insulative film covering a semiconductor layer;
   (b) etching said insulative film, via said first opening, to an excessive degree so as to etch said film to a predetermined distance under said masking pattern to form in said film a second opening substantially coextensive with, but larger than, said first opening;
   (c) etching said semiconductor layer, via said first opening, to form in said layer a third opening substantially coextensive with said first opening;
   (d) removing said etching mask;
   (e) etching said semiconductor layer, via said second opening, to an excess degree so as to etch said layer to a predetermined distance under said insulative film to form in said layer a fourth opening substantially coextensive with, but larger than, said second opening; and
   (f) removing undesired portions of said insulative film to expose said fourth opening;
   whereby, said first, third, second, and fourth openings are successively usable for etching and ion implantation processes for producing in an underlying semiconductor substrate a plurality of selected conductivity type regions of differing sizes without the need for application of successive masking patterns subject to registration constraints.

2. A single mask method for providing multiple masking patterns usable for developing a semiconductor substrate for a semiconductor device, as in claim 1, in which said etching mask comprises a photoresist.

3. A single mask method for providing multiple masking patterns usable for developing a semiconductor substrate for a semiconductor device, as in claim 1, in which:
   the predetermined distance in step (b) is approximately 7-8 microns; and
   the predetermined distance in step (e) is approximately 0.5 micron.

4. A single mask method for providing multiple masking patterns usable for developing a semiconductor substrate for a semiconductor device, as in claim 3, in which said etching mask comprises a photoresist.

5. A single mask method for providing multiple masking patterns useable for developing a semiconductor substrate for a semiconductor device, comprising the steps of:
   (a) forming an etching mask having a first opening exposing an area of an insulative film covering a semiconductor layer overlaying a film on a semiconductor substrate;
   (b) etching said insulative film, via said first opening, to an excess degree so as to etch said film to a predetermined distance under said masking pattern to form in said film a second opening substantially coextensive with, but larger than, said first opening;
   (c) etching said semiconductor layer, via said first opening, to form in said layer a third opening substantially coextensive with said first opening;
   (d) removing said etching mask;
   (e) implanting ions, via said third opening, to form a first diffused region in said substrate;
   (f) etching said semiconductor layer, via said second opening, to an excess degree so as to etch said layer to a predetermined distance under said insulative film to form in said layer a fourth opening substantially coextensive with, but larger than, said second opening;
   (g) implanting ions, via said second opening, to form a second diffused region in said substrate;
   (h) increasing the configuration of said first and second diffused regions by drive diffusion;
   (i) implanting ions, via said second opening, to form a third diffused region in said substrate; and
   (j) removing undesired portions of said insulative film to expose said fourth opening;
   (k) implanting ions, via said fourth opening, to form a fourth diffused region in said substrate;
   whereby, said first, third, second, and fourth openings are successively usable for etching and ion implantation processes for producing in an in an underlying semiconductor substrate a plurality of selected conductivity type regions of differing sizes without the need for application of successive masking patterns subject to registration constraints.

6. A single mask method for providing multiple masking patterns usable for developing a semiconductor substrate for a semiconductor device, as in claim 5, in which said etching mask comprises a photoresist.

7. A single mask method for providing multiple masking patterns usable for developing a semiconductor substrate for a semiconductor device, as recited in claim 5, in which:
   the predetermined distance in step (b) is approximately 7-8 microns; and
   the predetermined distance in step (f) is approximately 0.5 micron.

8. A single mask method for providing multiple masking patterns usable for developing a semiconductor substrate for a semiconductor device, as in claim 7, in which said etching mask comprises a photoresist.

9. A method of producing a semiconductor device having a semiconductor base layer of a first conductivity type; a first region of a second conductivity type, disposed on the surface of said semiconductor base layer; a second region of said second conductivity type, disposed within said second conductivity type first region and which is diffused more deeply; a third region of said second conductivity type, diffused concentrically with and shallower than either of said first or second regions of said second conductivity type; a first region of said first conductivity type, disposed within said second conductivity type first region bestriding said second conductivity type second and third regions, and diffused shallower than said second conductivity type third region; and an electrode disposed on the surface of the portion of said second conductivity type first region located between said first conductivity type semiconductor base layer and said first conductivity type first region, which comprises:

(a) etching an insulation film disposed on a polysilicon by an excessive degree or amount in the planar direction so as to form a predetermined distance between the edges of the outer peripheries of said second conductivity type first and second regions relative to said polysilicon;

(b) implanting ions for forming said second conductivity type second region, while using said polysilicon as a mask;

(c) etching said polysilicon by an excessive degree or amount in the planar direction such that the shunting resistance portion of said second conductivity type first region, disposed directly under said first conductivity type first region, is the desired length, while using said insulation film as a mask;

(d) implanting and diffusing ions for forming said second conductivity type first region;

(e) removing said insulation film form said polysilicon; and (f) forming said first conductivity type first region, while using said polysilicon as a mask.

10. A single mask method for providing multiple masking patterns usable for developing a semiconductor substrate for a semiconductor device, as in claim 9, in which:

the predetermined distance in step (a) is approximately 7–8 microns; and the predetermined distance in step (c) is approximately 0.5 micron.

* * * * *